United States Patent
Mak et al.

(10) Patent No.: US 7,250,309 B2
(45) Date of Patent: Jul. 31, 2007

(54) INTEGRATED PHASE ANGLE AND OPTICAL CRITICAL DIMENSION MEASUREMENT METROLOGY FOR FEED FORWARD AND FEEDBACK PROCESS CONTROL

(75) Inventors: Alfred W. Mak, Union City, CA (US); Yung-Hee Yvette Lee, San Jose, CA (US); Cynthia B. Brooks, Austin, TX (US); Melisa J. Buie, San Jose, CA (US); Turgut Sahin, Cupertino, CA (US); Jian Ding, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 296 days.

(21) Appl. No.: 10/754,321

(22) Filed: Jan. 9, 2004

(65) Prior Publication Data
US 2005/0153564 A1 Jul. 14, 2005

(51) Int. Cl.
*G01R 31/26* (2006.01)

(52) U.S. Cl. .................... 438/14; 438/15; 438/16; 438/17; 257/48; 250/307

(58) Field of Classification Search .............. None
See application file for complete search history.

(56) References Cited

U.S. PATENT DOCUMENTS

| | | | |
|---|---|---|---|
| 5,109,430 A * | 4/1992 | Nishihara et al. | 382/151 |
| 5,926,690 A * | 7/1999 | Toprac et al. | 438/17 |
| 6,245,581 B1 * | 6/2001 | Bonser et al. | 438/8 |
| 6,388,253 B1 | 5/2002 | Su | |
| 6,424,417 B1 | 7/2002 | Cohen et al. | |
| 6,486,492 B1 | 11/2002 | Su | |
| 6,689,519 B2 * | 2/2004 | Brown et al. | 430/30 |
| 6,891,627 B1 * | 5/2005 | Levy et al. | 356/625 |
| 6,961,626 B1 * | 11/2005 | Paik | 700/31 |

* cited by examiner

Primary Examiner—Duy-Vu N. Deo
(74) Attorney, Agent, or Firm—Patterson&Sheridan, LLP

(57) ABSTRACT

Methods and apparatus for controlling the critical dimensions and monitoring the phase shift angles of photomasks. Critical dimensions measurement data before wafer processing and after wafer processing are collected by an integrated metrology tool to adjust the process recipe, to determine if the critical dimensions are in specification and to determine if additional etching is required. Phase shift angle and uniformity across substrate measurement after wafer processing are collected by an integrated metrology tool to determine if the phase shift angle and its uniformity are in specification. The real time process recipe adjustment and determination if additional etching is requires allow tightening of the process control. The phase shift angle and uniformity monitoring allows in-line screening of phase shift photomasks.

19 Claims, 9 Drawing Sheets

INTEGRATED PHASE ANGLE AND OPTICAL CRITICAL DIMENSION MEASUREMENT METROLOGY FOR FEED FORWARD AND FEEDBACK PROCESS CONTROL

BACKGROUND OF THE INVENTION

1. Field of the Invention

The present invention relates to the fabrication of photomasks useful in the manufacture of integrated circuits.

2. Background of the Related Art

Photolithography techniques use light patterns and photoresist materials deposited on a substrate surface to develop precise patterns on the substrate surface prior to the etching process. In conventional photolithographic processes, a photoresist is applied on the layer to be etched, and the features to be etched in the layer, such as contacts, vias, or interconnects, are defined by exposing the photoresist to a pattern of light through a photolithographic photomask which corresponds to the desired configuration of features. A light source emitting ultraviolet (UV) light, for example, may be used to expose the photoresist to alter the composition of the photoresist. Generally, the exposed photoresist material is removed by a chemical process to expose the underlying substrate material. The exposed underlying substrate material is then etched to form the features in the substrate surface while the retained photoresist material remains as a protective coating for the unexposed underlying substrate material. Since photomasks are used repeatedly to create device patterns, quality control of photomask manufacturing is very important.

Photolithographic photomasks, or reticles, include binary (or conventional) photomasks and phase shift masks (PSM), which could be used in sub 0.13 µm technology. Binary (or conventional) masks typically include a substrate made of an optically transparent silicon based material, such as quartz (i.e., silicon dioxide, $SiO_2$), having an opaque light-shielding layer of metal, such as chromium, on the surface of the substrate. Phase shift masks improve the resolution of the aerial image by phase shifting. The principle of phase shift mask is described in P. 230-234 of Plummer, Deal and Griffin, "Silicon VLSI Technology Fundamentals, Practice and Modeling", 2000 by Prentice Hall, Inc. Phase shift masks could be either attenuated phase shift or alternate phase shift mask. An attenuated phase shift mask typically includes a substrate made of an optically transparent silicon based material, such as quartz, having a translucent layer of material, such as molybdenum silicide (MoSi) or molybdenum silicon oxynitride (MoSiON), on top. When the photolithographic light, e.g. at 248 nm wavelength, shines through the patterned mask surface covered by the translucent layer, the transmission (e.g. 6% at 248 nm wavelength) and the thickness of the translucent layer create a phase shift, e.g., 180°, compared to the photolithographic light that shines through the patterned mask surface not covered by the translucent layer. An alternate phase shift mask typically includes a substrate made of an optically transparent silicon based material, such as quartz, which is etched to a certain depth to create a phase shift with the un-etched transparent substrate when the photolithographic light shines through the patterned mask.

Photomasks allow light to pass therethrough in a precise pattern onto the substrate surface. The metal layer on the photomask substrate is patterned to correspond to the features to be transferred to the substrate. The patterns on the photomask could be 1×, 2× or 4× of patterns that will be patterned on the wafer substrate. Typically, a photolithographic stepper reduces the image of the photomask by 4× and prints the pattern on the photoresist covering the wafer surface. Conventional photomasks are fabricated by first depositing one to two thin layers of metal, which could either be opaque or translucent depending on the types of masks being formed, on a substrate comprising an optically transparent silicon based material, such as quartz, and depositing a photoresist layer on substrate. The photomask is then patterned using conventional laser or electron beam patterning equipment to define the critical dimensions in the photoresist. The top metal layer, typically opaque, is then etched to remove the metal material not protected by the patterned photoresist, thereby exposing the underlying silicon based material. For a binary mask, the photomask is formed after the metal etching step. While for attenuate and alternate phase shift masks, additional photoresist patterning and etching of transparent substrate or translucent metal layer are needed to form the photomask.

Since photomasks are used repeatedly to create device patterns, the accuracy and tight distribution of the critical dimensions, and the phase shift angle and its uniformity across the substrate are key requirements for binary and phase shift photomasks. Critical dimensions are defined here as the widths of features being measured and are affected by etching process. Overetching could enlarge the dimension, while underetching could result in wider dimension distribution or metal layer not completely etched. In the case of phase shift masks, the accuracy and tight distribution of the phase shift angle, typically 180°, are also key requirements. For attenuated phase shift mask, the phase shift angle is affected by the thickness and transparency of the translucent metal layer (e.g. MoSi), while for alternate phase shift mask, the phase angle is affected by the transparent material and its etch depth.

A conventional method of controlling critical dimensions for the photomasks comprises measuring the critical dimensions of the respective elements of the etched photomasks, statistically processing the results of such measurements, determining if the measurement passes the requirement, and adjusting the etch process performed on subsequent batches of the substrate. Unfortunately, this method does not compensate for substrate-to-substrate variations of the critical dimensions within a batch of substrates. Variables inherent to the etch process may broaden distribution for the critical dimensions. This means that the post-etch statistical distribution of the critical dimensions for etched structures may be broader than the pre-etch distribution of critical dimensions of the etched structure of the photomask. As such, some etched structures may have critical dimensions outside a pre-determined range of acceptable values.

A conventional method of monitoring phase shift angle for the photomasks comprises measuring the phase shift angles and the uniformity (or distribution) of the photomasks, statistically processing the results of such measurements, determining if the measurement passes the requirement, and adjusting the etch process performed on subsequent batches of the substrate. Variables inherent to the metal film deposition processes that affect metal film thickness and metal film transparency of an attenuated phase shift mask could make the phase shift angle measurement results of an attenuate phase shift photomask outside a pre-determined range of acceptable values. In addition, variables inherent to the etch process combined with the variables of the photomask lithography process may broaden the distribution of the etch depth, which affects phase shift angle and its uniformity for an alternate phase shift mask. As such, some etched structures may have phase shift angles outside a pre-determined range of acceptable values.

Therefore, there remains a need in the art for an improved method and apparatus for controlling the critical dimensions and monitoring phase shift angle and its uniformity of a photomask in a semiconductor photomask processing system.

SUMMARY OF THE INVENTION

The invention relates to a method and apparatus for controlling the critical dimensions and monitoring phase shift angle and its uniformity of photomask during fabrication of semiconductor photomasks in a semiconductor photomask processing system.

Aspects of the invention generally provide methods and apparatus for etching a metal layer deposited on a silicon based substrate, such as a photomask. In one aspect, a method of controlling the critical dimensions of a photomask substrate comprises providing a photomask substrate with a metal layer on top, performing a photolithographic process on the photomask substrate, measuring the pre-etch critical dimensions of the printed pattern by an integrated measuring tool, providing an initial etch recipe for a metal etch process, modifying the etch recipe based on the pre-etch critical dimension data, and performing the etch process on the photomask substrate based on the modified etch recipe. In a further aspect, the method comprises measuring post-etch critical dimensions of the etched pattern, and modifying the initial etch recipe for the next photomask substrate based on post-etch critical dimensions data. In yet another further aspect, the method comprises determining if the pre-etch critical dimensions are within specification, if the pre-etch critical dimensions are within specification, sending the substrate to the next process step, and if the pre-etch critical dimensions are out of specification, performing rework by removing photoresist from the substrate, and re-patterning the substrate with photoresist.

In another aspect, a method of monitoring the phase shift angle of a phase shift photomask comprises providing a photomask substrate with an etched metal layer, performing a photolithographic process on the photomask substrate, etching the photomask substrate, removing the remaining photoresist, removing the remaining metal layer, and measuring the phase shift angle and its uniformity across the substrate by an integrated measuring tool. In a further aspect, the method comprises determining if the measured data of phase shift angle and its uniformity across the substrate are within specification, if the measured data are within specification, the photomask process sequence is complete, and if the measured data are out of specification, the photomask is marked out of specification.

In another aspect, a method of monitoring the phase shift angle of a phase shift photomask comprises providing a photomask substrate with a light-shielding metal layer on top of a translucent metal layer, which is deposited on the substrate, performing a photolithographic process on the photomask substrate, etching the light-shielding metal layer, removing the remaining photoresist, etching the translucent metal layer, removing the light-shielding metal layer, and measuring the phase shift angle and its uniformity across the substrate by an integrated measuring tool. In a further aspect, the method comprises determining if the measured data of phase shift angle and its uniformity across the substrate are within specification, if the measured data are within specification, considering the photomask process sequence is complete, and if the measured data are out of specification, marking the photomask out of specification.

In another aspect, an apparatus for controlling the critical dimensions of a photomask substrate comprises a photomask etch chamber for processing a photomask substrate, a measuring tool for measuring critical dimension information prior to and after processing by the process chamber, and a computer system, coupled to the process chamber and the measurement tool, for storing the critical dimension information.

In another aspect, an apparatus for monitoring the phase shift angles of a phase shift photomask substrate comprises a process chamber for processing a substrate, a measuring tool positioned for measuring phase. shift angle and its uniformity across the substrate after the substrate is processed by the process chamber, and a computer system, coupled to the process chamber and the measurement tool, for storing the measured information.

In yet another aspect, an apparatus for controlling the critical dimension and monitoring phase shift angles of a phase shift photomask substrate comprises a process chamber for processing a substrate, a measuring tool positioned for measuring phase shift angle and its uniformity across the substrate after the substrate is processed by the process chamber, a measuring tool positioned for measuring critical dimension information prior to and after processing by the process chamber, and a computer system, coupled to the process chamber and the measurement tool, for storing the critical dimension information.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

For convenience, the present invention is described herein primarily with reference to the etching of phase shift masks. The. invention can be used for etching of other types of photomasks. Phase shift photomask etching processes, for light-shielding layer, such as such as chromium, optically transparent material, such as quartz, and attenuating material, such as MoSi, could be dry etching processes. Plasmas of etching gases, chlorine-containing gas (such as $Cl_2$) or fluorine-containing gas (such as $SF_6$ or $CF_4$), oxidizing gases, such as oxygen, and inert gases, such as helium, could be used to etch the metal layers formed on the substrate or the substrate itself. Details of etching chemistries that are used to etch light-shielding layer for this application have been disclosed in commonly assigned U.S. patent application Ser. No. 10/418,795, titled "Process For Etching Photomasks", and filed on Apr. 18, 2003 and U.S. patent application Ser. No. 10/235,223, titled "Methods And Apparatus For Etching Metal Layers on Substrates", and filed on Sep. 4, 2002. Etching of the silicon based material of the substrate is described in commonly assigned U.S. Pat. No. 6,534,417, titled "Method and Apparatus For Etching Photomasks", issued Mar. 18, 2003 and U.S. Pat. No. 6,391,790, also titled "Method and Apparatus For Etching Photomasks", issued May 21, 2002. Details of etching chemistries that are used to etch the translucent metal layer for this application have been disclosed in commonly assigned U.S. patent application Ser. No. 10/437,729, titled "Methods for Etching Photolithographic Reticles", filed on May 13, 2003. The disclosures of all of these applications are incorporated herein by reference to the extent not inconsistent with aspects of the invention.

Figure 1:
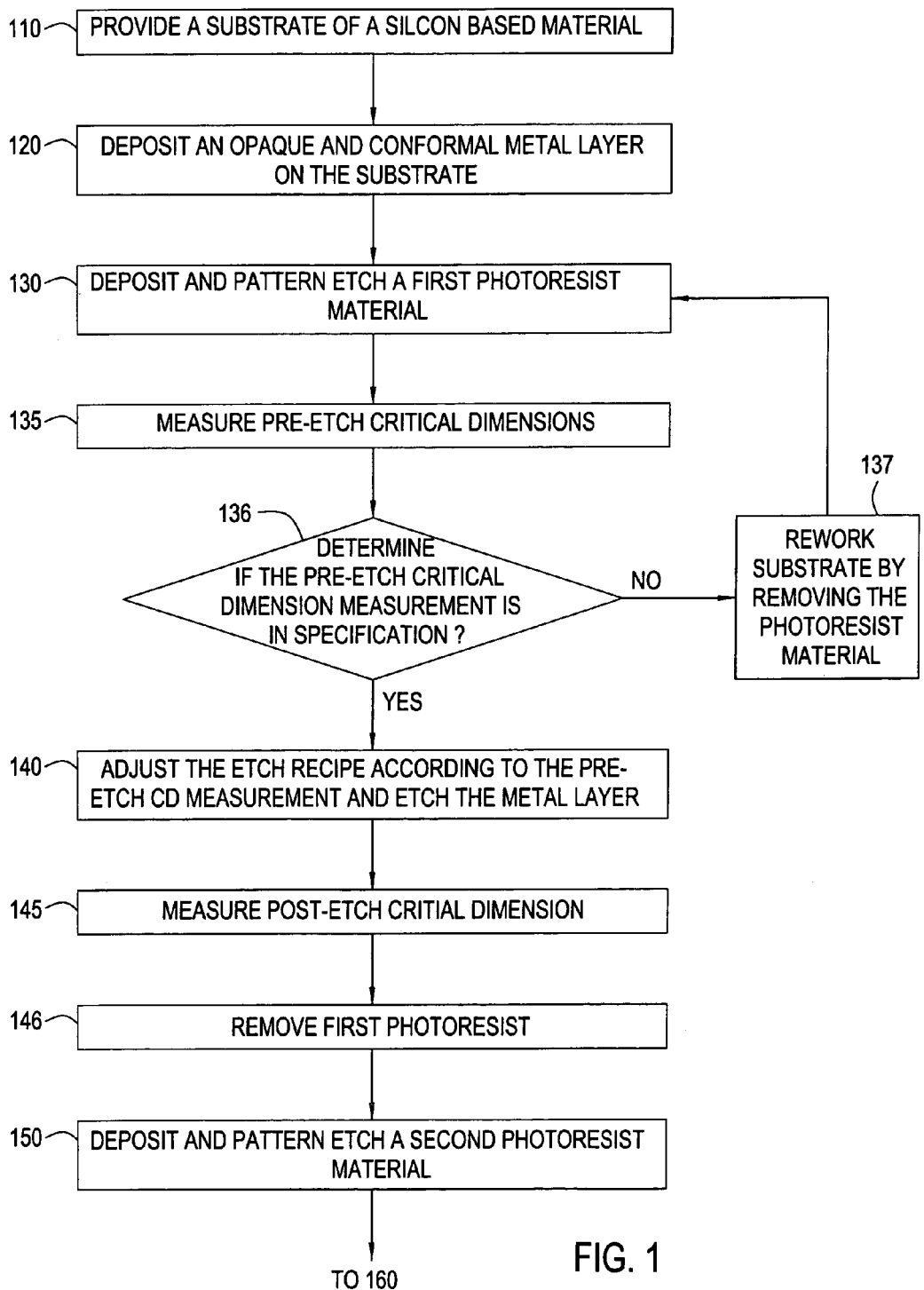
FIG. 1 is a flow chart illustrating one embodiment of a sequence for processing a substrate according to one embodiment of the invention.
Figure 1:
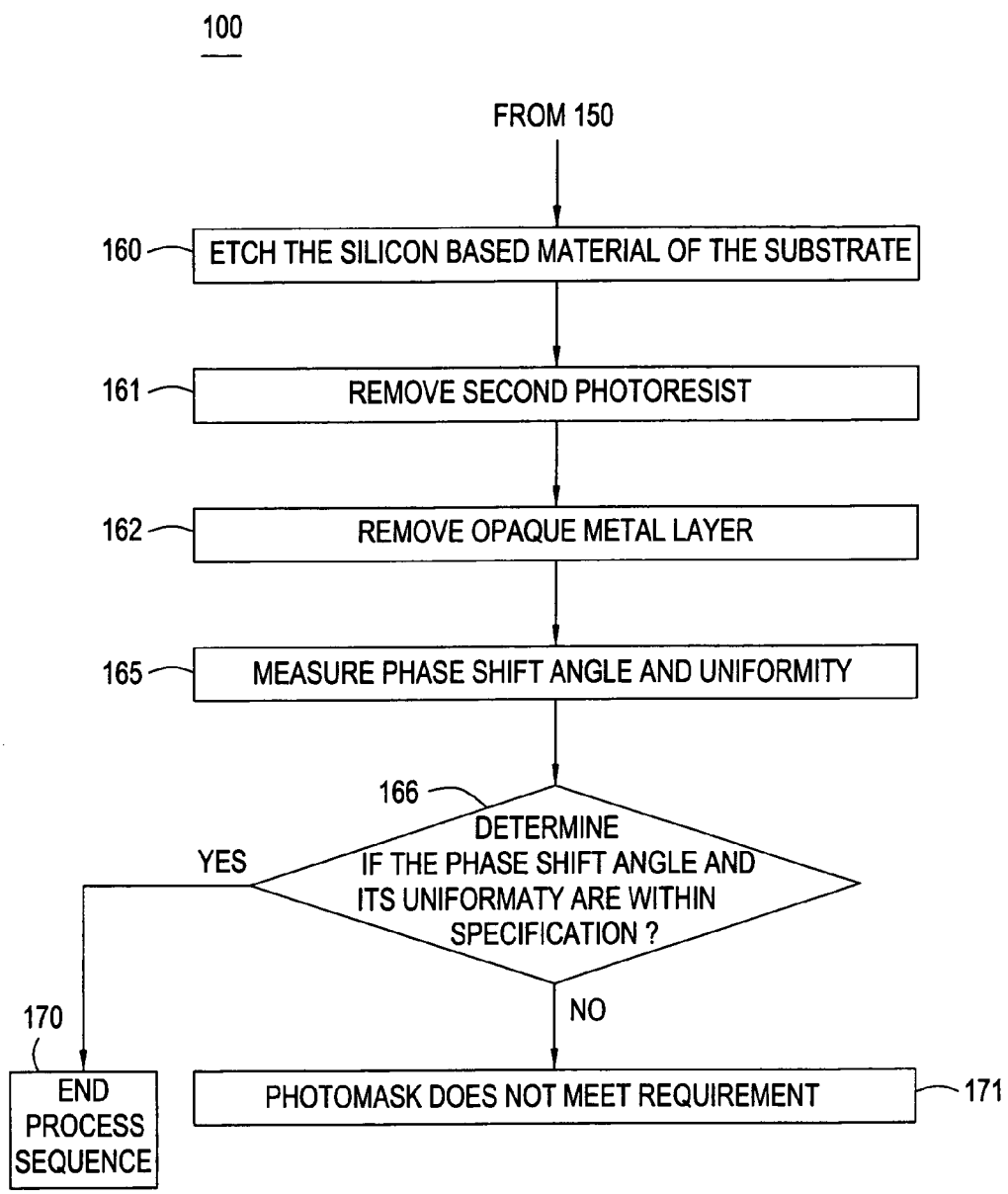

FIG. 1 is a flow chart of one embodiment of one process sequence of an etching process for an alternate phase shift photomask. The flow chart is provided for illustrative purposes and should not be construed as limiting the scope of aspects of the invention. A photomask substrate, typically comprising a silicon based material, such as optical quality quartz, is provided to a processing chamber at step 110. Suitable plasma etch chamber includes the Tetra II™ photomask etch chamber 702 of FIG. 7, or optionally, the Decoupled Plasma Source (DPS®) II processing chamber 600 of FIG. 6, both available from Applied Materials, Inc. of Santa Clara, Calif. Other process chamber may be used to perform the processes of the invention. Photomask sizes range from three to nine inches squares, but most masks produced today are five or six inches square. The photomask substrate is then processed by depositing an opaque and conformal metal layer, for example chromium, on the substrate at step 120.

The dimensions of features to be formed in the metal layer are patterned by depositing and pattern etching a first resist material to expose the conformal metal layer at step 130. To ensure accurate and tight distributions of pattern dimensions are printed on the photomask, the substrates with patterned photoresist layer are sent to an integrated critical dimensions (CDs) measuring tool to determine pre-etch CDs and profile at step 135. At step 136, the inspection results are used to determine if the pre-etch CDs are within specification and the substrate should be etched at step 140 or be reworked at step 137 and re-patterned with photoresist at step 130. If the substrate should be etched, the pre-etch measurement results are used at step 140 to adjust process parameters (feedforward), such as etch time and/or etch parameters.

An example of a processing step that benefits from the complete feedforward solution of the present invention is etch processing that is sensitive to incoming photoresist (PR) dimensions. The variation in incoming resist mask CD creates a proportional variation in the final etched CD. Measuring the incoming resist CD prior to etching enables the etch process to be tuned to compensate for the variations due to lithography.

After etching, the wafer is optionally cleaned, as by an ash photoresist strip followed by a wet cleaning step, and transferred back to the integrated metrology unit, where the CDs, profile and depth of features formed by the etch process are measured by an integrated CD measuring tool and compared to the desired dimensions at step 140. Such information can be fed back to the processor (e.g., to compensate for etch process drift) by adjustment of the etch recipe when etching the next substrate.

By taking into account photoresist CD and profile variation when choosing an etch recipe, the present invention decouples post-etch CD from pre-etch CD and profile. By measuring the incoming resist CD and adjusting the process parameters, such as etch time, the etch process can compensate for variations in lithography on successive wafers. With automatic compensation of incoming resist CD from the lithography step, a much tighter distribution of post-etch CD is achieved by the present invention, and the final CD uniformity becomes a realistic etch specification without impacting the productivity of the etch tool.

To optimize production efficiency, post-etch measurements for closed loop control must be made directly on the wafer before it leaves the etcher. CDSEM (critical dimension scanning electron microscope) measurement can require time-consuming wet cleaning, particularly when etch byproducts cling to the sidewalls of the etched structure. Such deposits render top-down CDSEM post-etch measurements inaccurate. Optical CD (OCD) metrology is insensitive to thin layers of deposits, making it possible to take accurate in-situ post-etch measurements, eliminate the cycle time penalty of wet cleaning, and immediately feed back data to the process controller.

After the post-etch CD measurement at step 145, the remaining resist materials are removed at step 146. The substrate may then be further processed to etch the silicon based material. The silicon based material of the substrate is prepared for etching by depositing and pattern etching a second resist material at step 150 to expose the substrate. The purpose of this substrate etch is to create an etch depth that will result in uniform and desired phase shift angle, such as 180°.

The substrate is then transferred to a processing chamber, such as Tetra II™ or DPS® II, where a processing gas mixture comprising a fluorine-containing gas, such as $CF_4$, $CHF_3$ or $C_2F_6$, an oxidizing gas, such as oxygen, and an inert gas, such as helium, is introduced into the processing chamber and a plasma is generated, thereby etching the exposed silicon based material of the substrate at step 160. After the substrate is etched, the remaining photoresist is removed at step 161. At step 162, the remaining opaque metal layer is removed either by dry etch or wet etch.

After the remaining photoresist and opaque metal layer are removed, the substrate is sent to a phase shift angle measurement tool, to determine phase shift angle and its uniformity across the photomask substrate 165. Phase shift angles are collected on multiple locations across the substrate to measure its uniformity across the substrate.

At step 166, it is determined whether the phase shift angle and uniformity measurement fall within the specification. If so, at step 170 the process sequence is considered complete. If the phase shift angle and uniformity measurement is out of the specification, the photomask is marked as not meeting the requirement at step 171 and could be discarded.

OCD (optical critical dimension) metrology techniques as employed by the present invention are advanced process control (APC) enablers and utilize novel technology to the CD measurement world where the current SEM-based systems are becoming inadequate. For example, normal incidence spectroscopic OCD metrology systems provide detailed line profiles not possible with in-line non-destructive SEMs. For photomasks, the OCD metrology can operate under reflective mode (utilizing reflected light) or transmission mode (utilizing transmitted light). The compact size and speed of OCD technology enables the measurement system of the present invention to be fully integrated into a process tool, such as Applied Materials' Tetra II™ or DPS® II etch system. When combined with APC software, this provides a complete, feed-forward solution for wafer-to-wafer closed loop control. An example of the optical CD measuring tool is the Nano OCD 9000 available from Nanometrics of Milpitas, Calif., or an optical imager as disclosed in U.S. Pat. No. 5,963,329. The optical CD measuring tool can utilize scatterometry, reflectometry or transmission ellipsometry techniques.

Phase shift angle metrology techniques as employed by the present invention are also advanced process control (APC) enablers. It detects the reflected and transmitted light of a substrate over a broad wavelength range. The detected wavelength spectra are fitted to a theoretical model to enable the characterization of the film. The metrology can be used to measure transparency, film thickness and phase shift angle at multiple locations on the substrate. An example of the phase shift angel measuring tool is the n&k Analyzer 1512RT available from n&k Technology, Inc. of Santa Clara, Calif.

Figure 2:
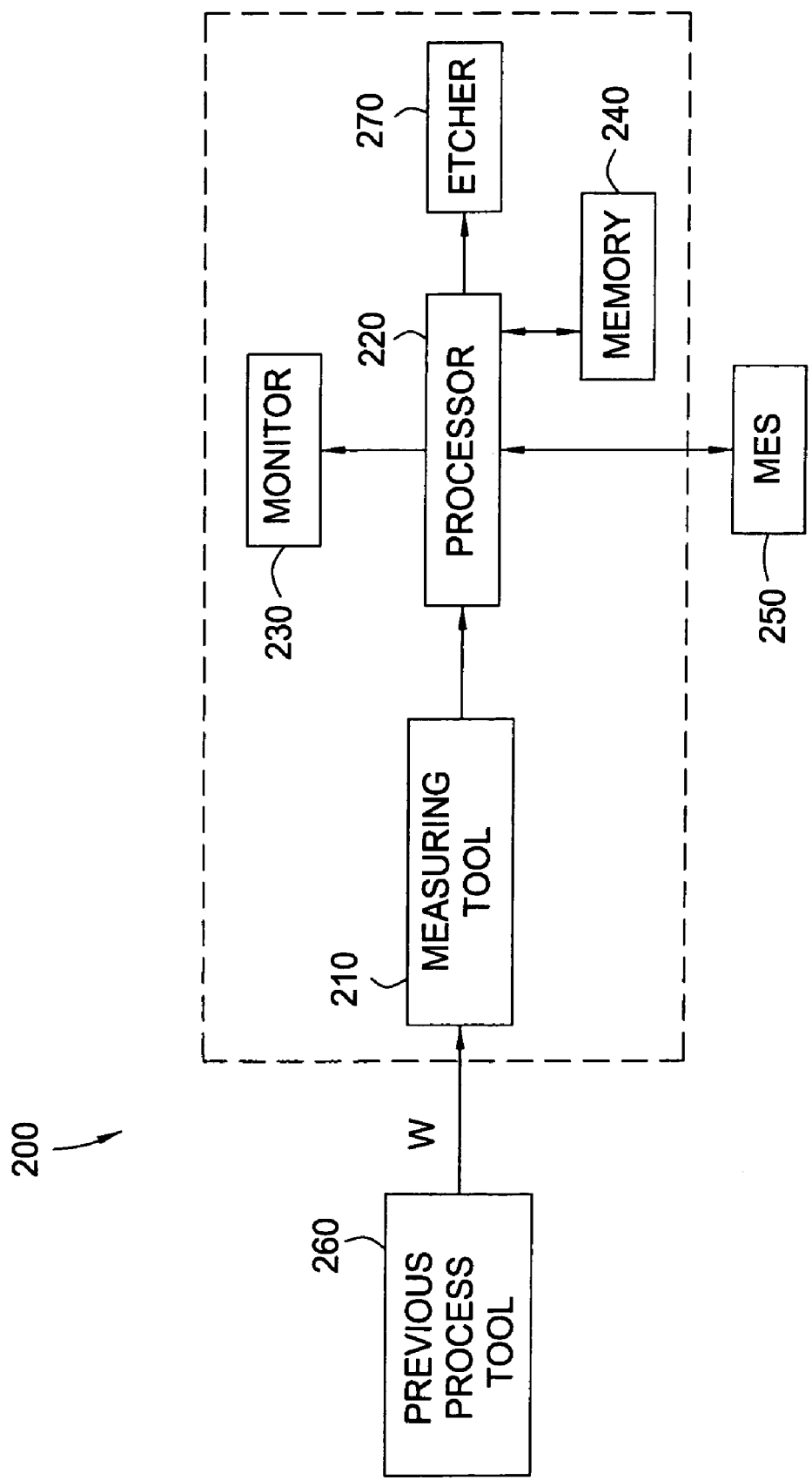
FIG. 2 is a block diagram of key components of an integrated etch system.

An exemplary embodiment of the present invention is implemented using a critical dimension or phase shift angle measuring tool in a processing line 200, as shown in FIG. 2, comprising a measuring tool 210, e.g., an optical CD measuring tool or a phase shift angle measuring tool. Processing line 200 further comprises a processor 220, which performs the analysis disclosed herein electronically, and a monitor 230 for displaying results of the analyses of processor 220. Processor 220 can be in communication with a memory device 240, such as a semiconductor memory, and a computer software-implemented database system 250 known as a "manufacturing execution system" (MES) conventionally used for storage of process information. Processor 220 can also be in communication with previous process tool 260 and etcher 270.

Figure 3:
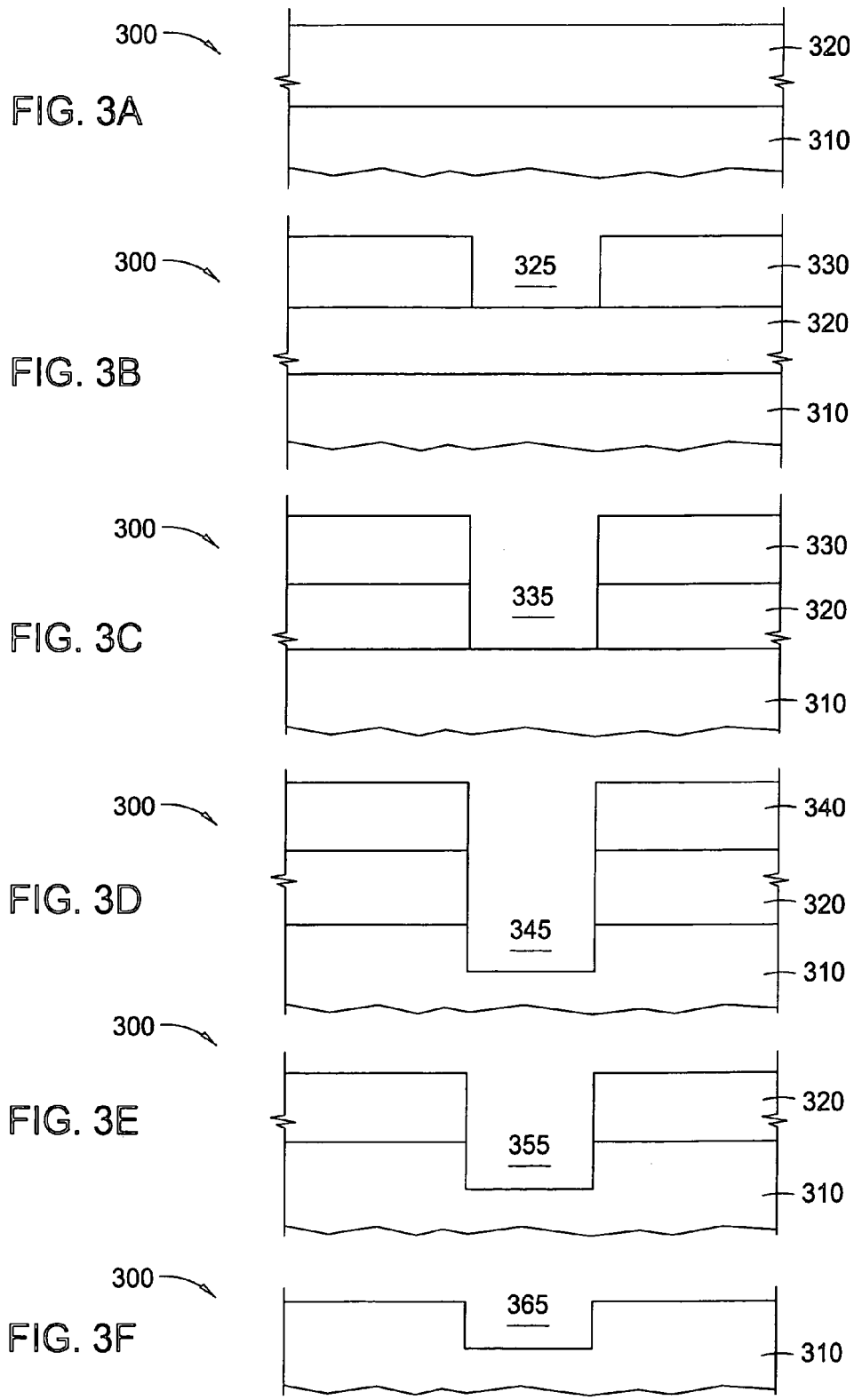
FIGS. 3A-3F are cross-sectional views showing an etching sequence of another embodiment of the invention.

FIGS. 3A-3F illustrate the composition of the photomask prior to the etching steps as well as further illustrate the process described above in FIG. 1. A substrate 300 is introduced into a processing chamber. The substrate 300 (or reticle) comprises a base material of an optically transparent material 310, for example, optical quality quartz, calcium fluoride, alumina, sapphire, or combinations thereof, typically made of optical quality quartz material. An opaque (or light-shielding) metal layer 320, such as chromium, is deposited on the optically transparent material 310 as shown in FIG. 3A. The light-shielding metal layer, such as chromium layer, may be deposited by conventional methods known in the art, such as by physical vapor deposition (PVD) or chemical vapor deposition (CVD) techniques. The light-shielding (or opaque) metal layer 320 is typically deposited to a thickness between about 50 and about 150 nanometers (nm) thick, however, the depth of the layer may change based upon the requirements of the manufacturer and the composition of the materials of the substrate or metal layer.

Referring to FIG. 3B, the substrate 300 is then transferred to another processing chamber where a layer of resist material 330, such as "RISTON," manufactured by Du Pont de Nemours Chemical Company, is deposited upon the opaque metal layer 320 to a thickness between about 200 and 600 nm thick. The resist material 330 is then pattern etched using conventional laser or electron beam patterning equipment to form a first opening 325 which is used to define the dimensions of the second opening 335 to be formed in the opaque metal layer 320.

The substrate 300 is then transferred to an etch chamber, such as the Tetra II™ photomask etch chamber described in FIG. 7 or DPS® II processing chamber 600 described in FIG. 6 (see below), and the light-shielding metal layer 320 is etched using metal etching techniques known in the art or by new metal etching techniques that may be developed to form the second opening 335 which expose the underlying transparent material 310 as shown in FIG. 3C. Details of etching chemistries that are used to etch the light-shielding metal layer for this application have been disclosed in commonly assigned U.S. patent application Ser. No. 10/418,795, titled "Process For Etching Photomasks", and filed on Apr. 18, 2003 and U.S. patent application Ser. No. 10/235,223, titled "Methods And Apparatus For Etching Metal Layers on Substrates", and filed on Sep. 4, 2002.

Referring to FIGS. 3A-3C, after etching of the light-shielding metal layer 320 is completed, the substrate 300 is transferred to a processing chamber, and the remaining resist material 330 is usually removed from the substrate 300, such as by an oxygen plasma process, or other resist removal technique known in the art.

Referring to FIGS. 3D-3F, the substrate 300 may be further processed by etching the transparent material 310. In etching the transparent material 310, the resist material 330 is removed and a second resist material 340 is applied and patterned to expose the underlying transparent material 310 within the second opening 335. The resist material is deposited to a depth between about 200 nm and 600 nm thick, but may be of any thickness and may also be of the same thickness as the depth of the features to be etched in the transparent material 310 to form the photomask. The substrate 300 is then etched to form a third opening 345 in the resist layer 340, the metal layer 320, and the transparent material 310. The patterned substrate 300 is then transferred to an etch chamber, such as the Tetra II™ photomask etch chamber 702 of FIG. 7 or DPS® II processing chamber 600 of FIG. 6 (see below), for plasma etching the transparent material 310. The second resist material 340 is then removed to form a patterned substrate surface 355. Afterwards, the metal layer 320 is removed to form a patterned substrate surface 365.

Figure 4:
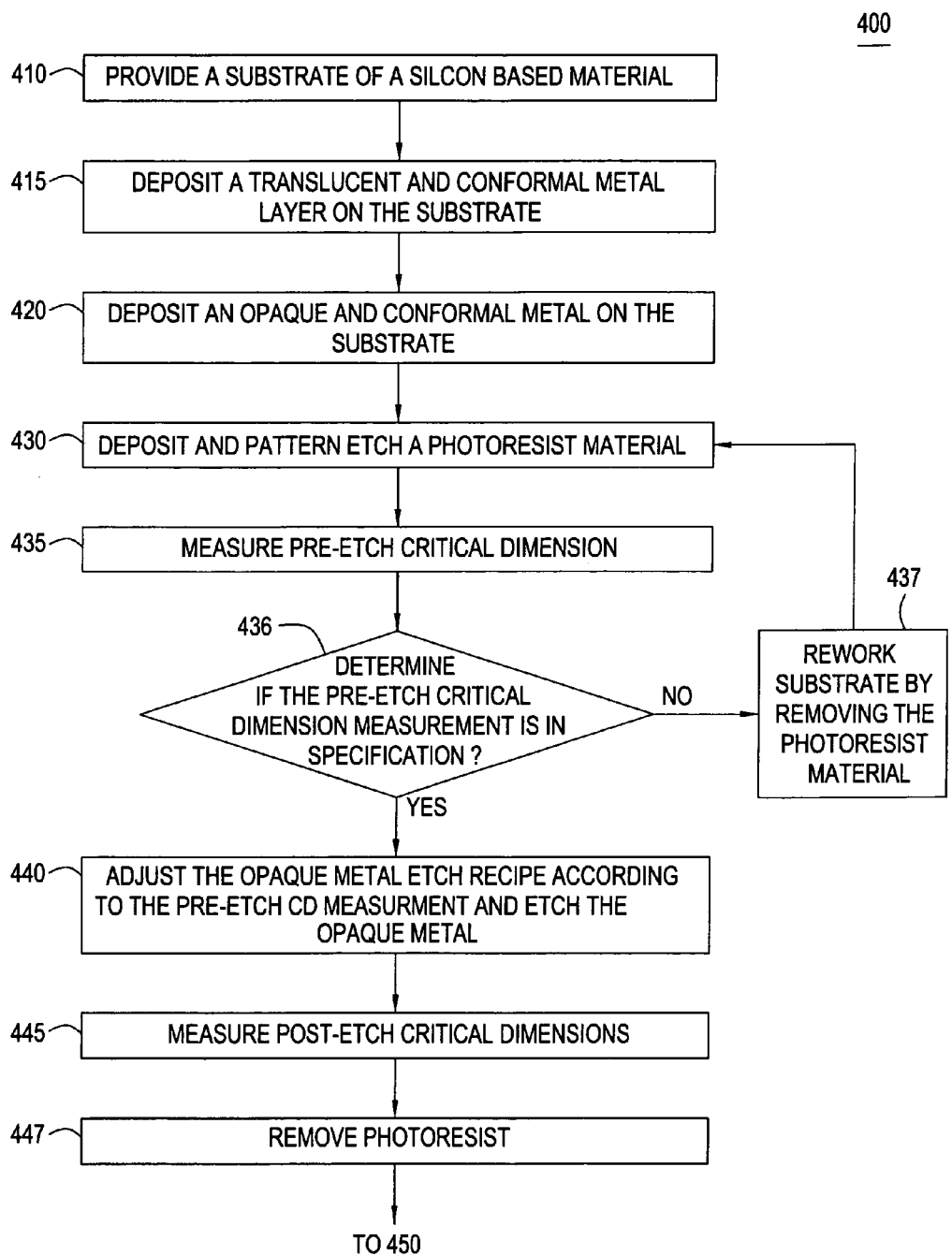
FIG. 4 is a flow chart illustrating one embodiment of a sequence for processing a substrate according to another embodiment of the invention.
Figure 4:
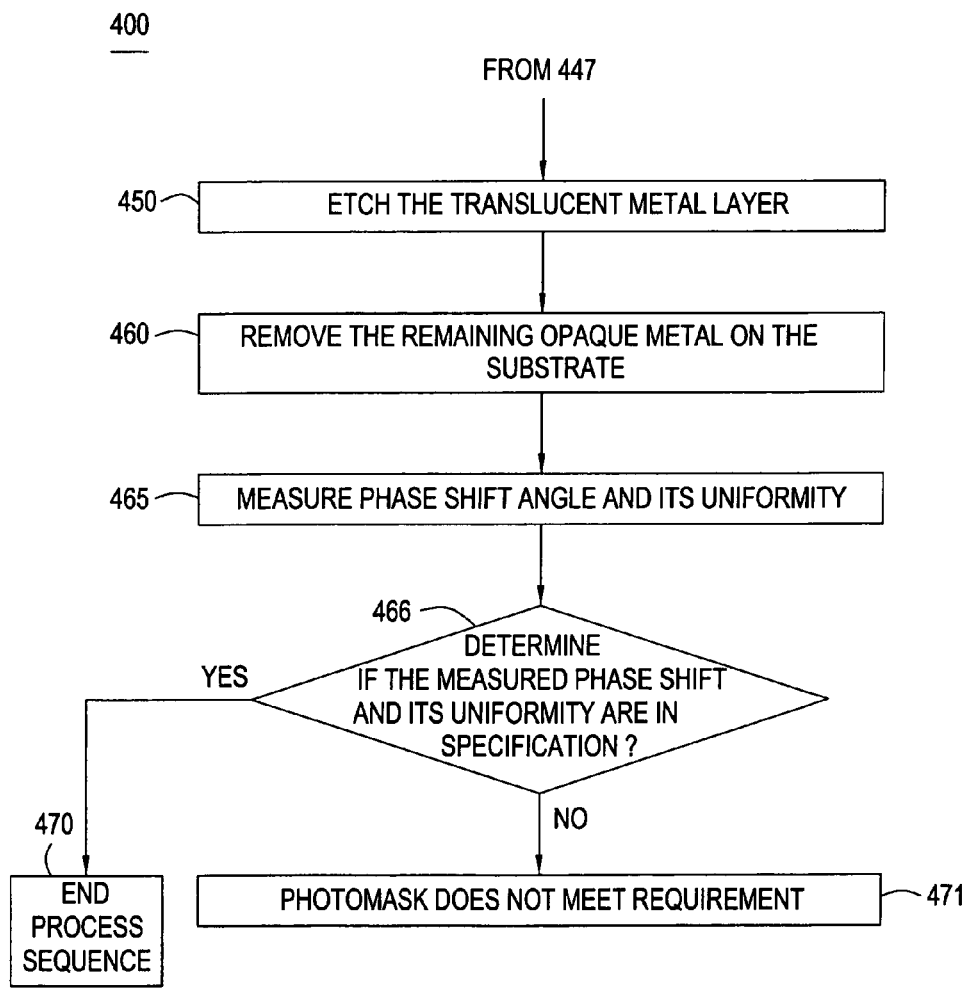

For attenuated phase shift mask, the phase shift angle is affected by the translucent metal, such as MoSi, film thickness and its film transparency. FIG. 4 is a flow chart of one embodiment of one process sequence of an etching process. The flow chart is provided for illustrative purposes and should not be construed as limiting the scope of aspects of. the invention. A substrate is provided to a processing chamber at step 410, such as the Tetra II™ photomask etch chamber 702 of FIG. 7 or DPS® II processing chamber 600 of FIG. 6 (see below). The substrate 300 (or reticle) comprises a base material of an optically transparent material 310, for example, optical quality quartz, calcium fluoride, alumina, sapphire, or combinations thereof, typically made of optical quality quartz material. The substrate is then processed by depositing a translucent and conformal metal layer, for example molybdenum silicide (MoSi), on the substrate at step 415, followed by depositing an opaque (or light-shielding) and conformal metal layer at step 420, such as chromium. Afterwards, the substrate is deposited and patterned with photoresist 430. To ensure accurate and tight distribution of pattern dimensions are printed on the photomask, at step 435 the substrates with patterned photoresist layer are sent to a critical dimension measurement tool to determine pre-etch CD and profile, then at step 436 the measurement results are used to determine if the pre-etch CDs are within specification, and the substrate should be etched at step 440 or be reworked at step 437 and re-patterned with photoresist at step 430. If the substrate should be etched, at step 440 the pre-etch measurement results are used to adjust process parameters, such as etch time and/or etch parameters.

After the substrate is etched and measured with critical dimensions, at step 447 the photoresist is stripped from the substrate surface. The. substrate is then sent to an etch chamber at step 450 to etch the translucent metal layer (e.g. MoSi) using the patterned opaque metal (e.g. Cr) layer as a mask.

After the etching of the translucent metal layer, at step 460 the opaque metal layer is removed from the substrate surface. The substrate is then sent, at step 465, to a phase shift angle measurement tool to determine the film transparency, phase shift angle and phase shift angle uniformity across the photomask substrate. Phase shift angle for attenuated phase shift mask is determined by the thickness and transparency of the translucent film. The phase shift angles are collected on multiple locations across the substrate to measure its uniformity across the substrate. At step 466, it is determined whether the transparency, phase shift angle and phase shift angle uniformity measurement fall within the specification 466. If so, the substrate process sequence is complete at step 470. If the transparency, phase shift angle and phase shift angle uniformity measurement is out of the specification, the photomask is marked out of specification at step 471 and could be discarded.

Figure 5:
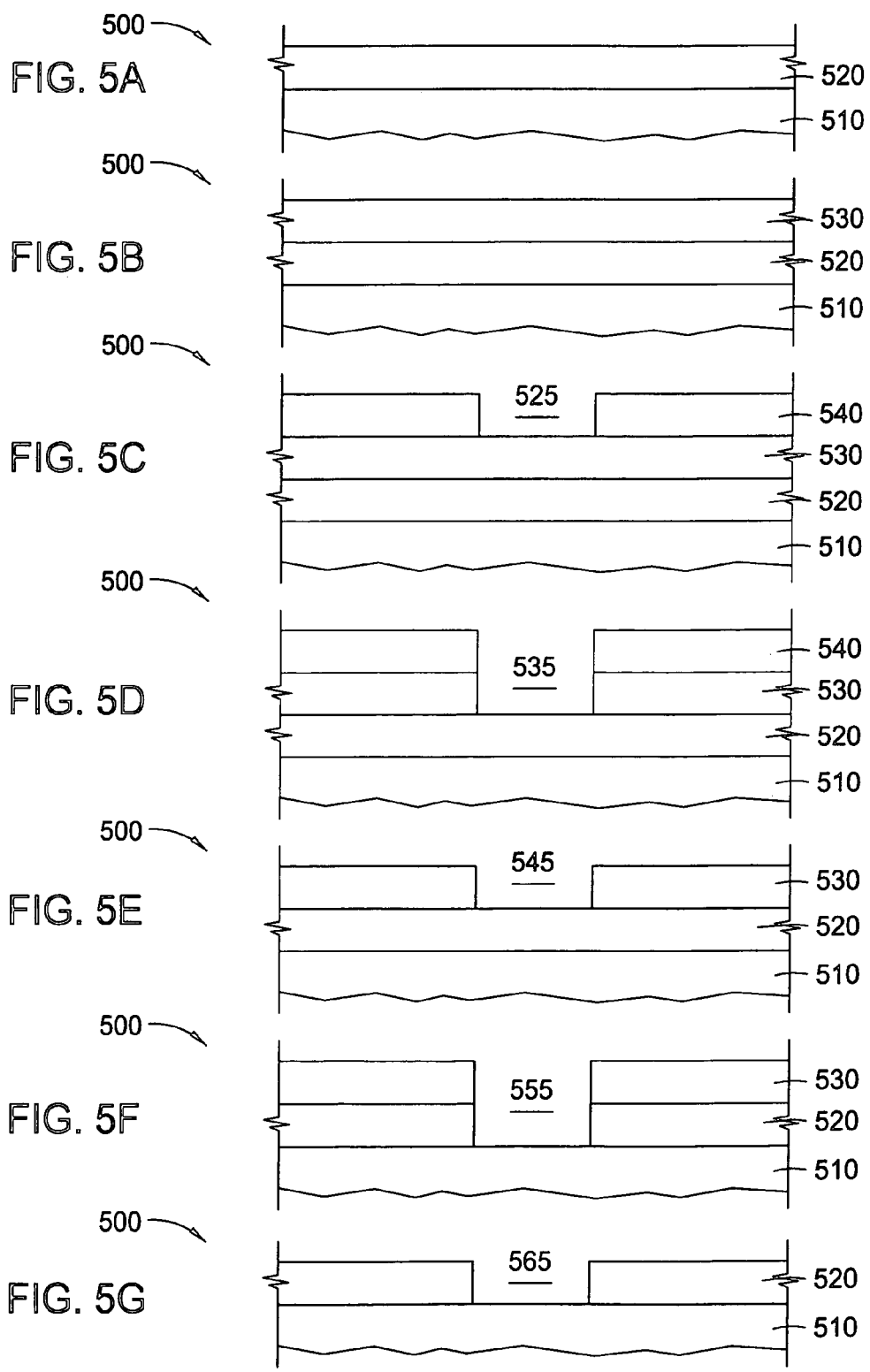
FIGS. 5A-5G are cross-sectional views showing an etching sequence of another embodiment of the invention.

FIGS. 5A-5G illustrate the composition of the photomask prior to the etching steps as well as further illustrate the process described above in FIG. 4. A substrate 500, typically made of optical quality quartz material 510, is introduced into a processing chamber. A translucent metal layer 520, such as MoSi, is deposited on the transparent material 510 as shown in FIG. 5A. The translucent metal layer may be deposited by conventional methods known in the art, such as by physical vapor deposition (PVD) or chemical vapor deposition (CVD) techniques. The translucent metal layer 520 is typically deposited to a thickness between about 50 and about 150 nanometers (nm) thick, however, the depth of the layer may change based upon the requirements of the manufacturer and the composition of the materials of the substrate or metal layer.

Referring to FIG. 5B, the substrate 500 is deposited with an opaque metal layer 530, such as chromium, on the translucent metal layer 520. The opaque (or light-shielding) metal layer may be deposited by conventional methods known in the art, such as by physical vapor deposition (PVD) or chemical vapor deposition (CVD) techniques. The opaque layer 530 is typically deposited to a thickness between about 50 and about 150 nanometers (nm) thick, however, the depth of the layer may change based upon the requirements of the manufacturer and the composition of the materials of the substrate or metal layer.

Referring to FIG. 5C, the substrate 500 is then transferred to another processing chamber where a layer of resist material 540, such as "RISTON," manufactured by Du Pont de Nemours Chemical Company, is deposited upon the opaque metal layer 530 to a thickness between about 200 and 600 nm thick. The resist material 540 is then pattern etched using conventional laser or electron beam patterning equipment to form a first opening 525 which is used to define the dimensions of the second opening 535 to be formed in the opaque metal layer 530.

The substrate 500 is then transferred to an etch chamber, such as a Tetra II™ or a DPS® II processing chamber, and the opaque layer 530 is etched using metal etching techniques known in the art or by new metal etching techniques described above that may be developed to form the second opening 535 which exposes the underlying translucent metal layer 520 as shown in FIG. 5D.

Referring to FIGS. 5A-5D, after etching of the opaque metal layer 530 is completed, the substrate 500 is transferred to a processing chamber, and the remaining resist material 540 is usually removed from the substrate 500, such as by an oxygen plasma process, or other resist removal technique known in the art.

Referring to FIGS. 5E, 5F and 5G, the substrate 500 may be further processed by etching the translucent metal layer 520. In etching the translucent metal layer 520, the etched opaque metal layer is used to create an etching pattern. The substrate 500 is then etched to form an opening 555 in the opaque metal layer 530, the translucent metal layer 520, and the transparent material 510. The remaining opaque metal layer 530 is removed to form a patterned substrate surface 565.

Aspects of the invention will be described below in reference to an inductively coupled plasma etch chamber that includes the Tetra II™ photomask etch chamber or the Decoupled Plasma Source, or DPS® II, chamber, both manufactured by Applied Materials, Inc., of Santa Clara, Calif. Other process chambers may be used to perform the processes of the invention, including, for example, capacitively coupled parallel plate chambers and magnetically enhanced ion etch chambers as well as inductively coupled plasma etch chambers of different designs. Although the processes are advantageously performed with the Tetra II™ photomask etch chamber, the description in conjunction with the DPS® II processing chamber is illustrative, and should not be construed or interpreted to limit. the scope of aspects of the invention.

Figure 6:
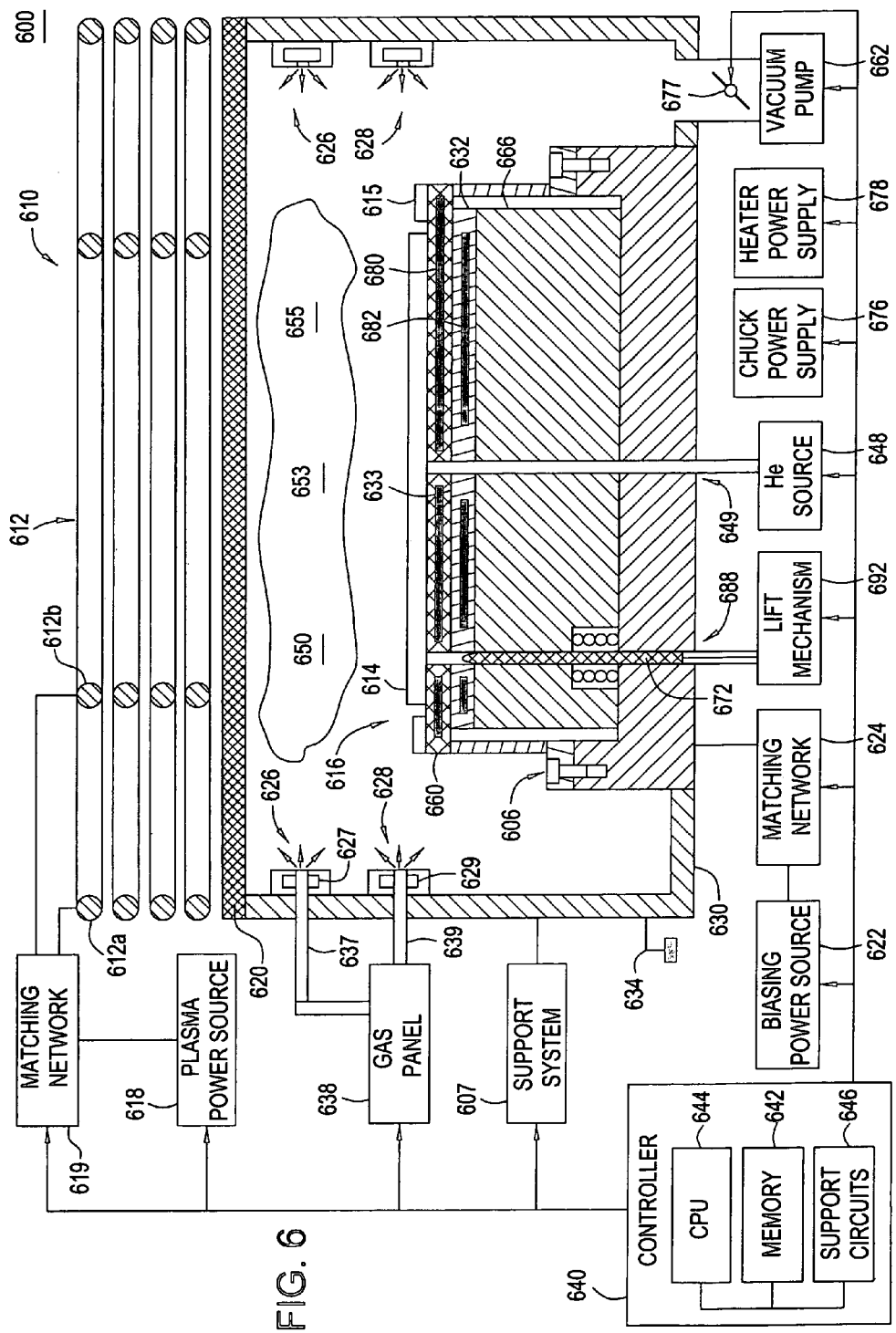
FIG. 6 is a schematic diagram of an etch chamber.

FIG. 6 depicts a schematic diagram of an exemplary Decoupled Plasma Source (DPS®) II etch reactor 600 that may illustratively be used to practice the invention. The DPS® II reactor 600 is a processing module of a Centura® integrated semiconductor wafer processing system available from Applied Materials, Inc. of Santa Clara, Calif. The particular embodiment of the reactor 600 shown herein is provided for illustrative purposes and should not be used to limit the scope of the invention.

The reactor 600 generally comprises a process chamber 610 having a substrate pedestal 616 within a conductive body (wall) 630, and a controller 640. The chamber 610 is supplied with a substantially flat dielectric ceiling 620. Other modifications of the chamber 610 may have other types of ceilings, e.g., a dome-shaped ceiling. Above the ceiling 620 is disposed an antenna 612 comprising one ore more inductive coil elements (two co-axial elements 612a and 612b are shown) that may be selectively controlled. The antenna 612 is coupled, through a first matching network 619, to a plasma power source 618. The plasma power source 618 typically is capable of producing up to 3000 W at a tunable frequency in a range from 50 kHz to 13.56 MHz.

The substrate pedestal (cathode) 616 is coupled, through a second matching network 624, to a biasing power source 622. The biasing source 622 generally is a source of up to 500 W at a frequency of approximately 13.56 MHz that is capable of producing either continuous or pulsed power. In other embodiments, the source 622 may be a DC or pulsed DC source.

A controller 640 comprises a central processing unit (CPU) 644, a memory 642, and support circuits 646 for the CPU 644 and facilitates control of the components of the process chamber 610 and, as such, of the etch process, as discussed below in further detail.

An etchant gas and a passivation gas are provided to the process chamber 610 from a gas panel 638. The etchant gas is typically supplied through one or more inlets 626 (two inlets are shown) located above the substrate pedestal 616. The passivation gas is supplied from the gas panel 638 through a plurality of inlets 628 (e.g., openings, injectors, and the like). The inlets 628 (two inlets are shown) are generally located substantially equidistantly around the substrate pedestal 616 approximately coplanar with a semiconductor wafer 614 being etched. Embodiment and location of the inlets 628 are selected to provide high controlled concentration of the passivation gas in a peripheral region (i.e., annular region near the edge) of the wafer 614.

The etchant gas and the passivation gas are delivered to the process chamber 610 using separate gas conduits (conduits 637 and 639, respectively) and do not mix until they are dispersed into a reaction volume 653 of the chamber. In the depicted embodiment, the etchant gas is provided to the inlets 626 using an annular gas channel 627 and, similarly, the passivation gas is provided to the inlets 628 using an annular gas channel 629. The gas channels 627 and 629 may be formed in the wall 630 or in gas rings (as shown) that are coupled to the wall 630. In the process chamber 610, the etchant and passivation gases form a gaseous mixture 650. During an etch process, the gaseous mixture 650 is ignited into a plasma 655 by applying power from the plasma source 618 to the antenna 612.

The gas pressure in the chamber 610 is controlled using a throttle valve 677 and a vacuum pump 662. The temperature of the wall 630 may be controlled using liquid-containing conduits (not shown) that run through the wall 630. Typically, the chamber wall 630 is formed from a metal (e.g., aluminum (Al), stainless steel, and the like) and coupled to an electrical ground 634.

In operation, the temperature of the wafer 614 is controlled by stabilizing a temperature of the substrate pedestal 616. In one embodiment, a backside gas (e.g., helium (He)) from a gas source 648 is provided via a gas conduit 649 to channels that are formed in the pedestal surface under the wafer 614. The backside gas is used to facilitate heat transfer between the pedestal 616 and the wafer 614. During the processing, the pedestal 616 may be heated by an embedded resistive heater 632 to a steady-state temperature and then the helium gas facilitates uniform heating of the wafer 614. Using such thermal control, the wafer 614 may be maintained at a temperature between about 0 and 350 degrees Celsius.

In one embodiment, the substrate pedestal 616 comprises an electrostatic chuck 660, an edge ring 615, the resistive heater 632, a heat sink 666, and a mounting assembly 606. The electrostatic chuck 660 comprises at least one clamping electrode 680 and is controlled by a chuck power supply 676. The resistive heater 632 generally comprises at least one heating element 682 and is regulated by a heater power supply 678. In alternative embodiments, the substrate pedestal 616 may comprise a susceptor clamp ring, a mechanical chuck, and the like substrate retention mechanism.

In operation, the lift mechanism 692 is used to raise the substrate 614 off the substrate support 616 or to lower the substrate onto the substrate support. Generally, the lift mechanism 162 comprises a plurality of lift pins 672 (one lift pin is shown) that travel through respective guide holes 688. The process chamber 610 also comprises conventional systems for process control, internal diagnostic, end point detection, and the like. Such systems are collectively shown as support systems 607.

Those skilled in the art will understand that other forms of etch chambers may be used to practice the invention, including chambers with remote plasma sources, electron cyclotron resonance (ECR) plasma chambers, and the like.

To facilitate control of the process chamber 610, the controller 640 may be one of any form of general-purpose computer processor that can be used in an industrial setting for controlling various chambers and sub-processors. The memory, or computer-readable medium, 642 of the CPU 644 may be one or more of readily available memory such as random access memory (RAM), read only memory (ROM), floppy disk, hard disk, or any other form of digital storage, local or remote. The support circuits 646 are coupled to the CPU 644 for supporting the processor in a conventional manner. These circuits include cache, power supplies, clock circuits, input/output circuitry and subsystems, and the like. The inventive method is generally stored in the memory 642 as a software routine. Alternatively, such software routine may also be stored and/or executed by a second CPU (not shown) that is remotely located from the hardware being controlled by the CPU 644.

Figure 7:
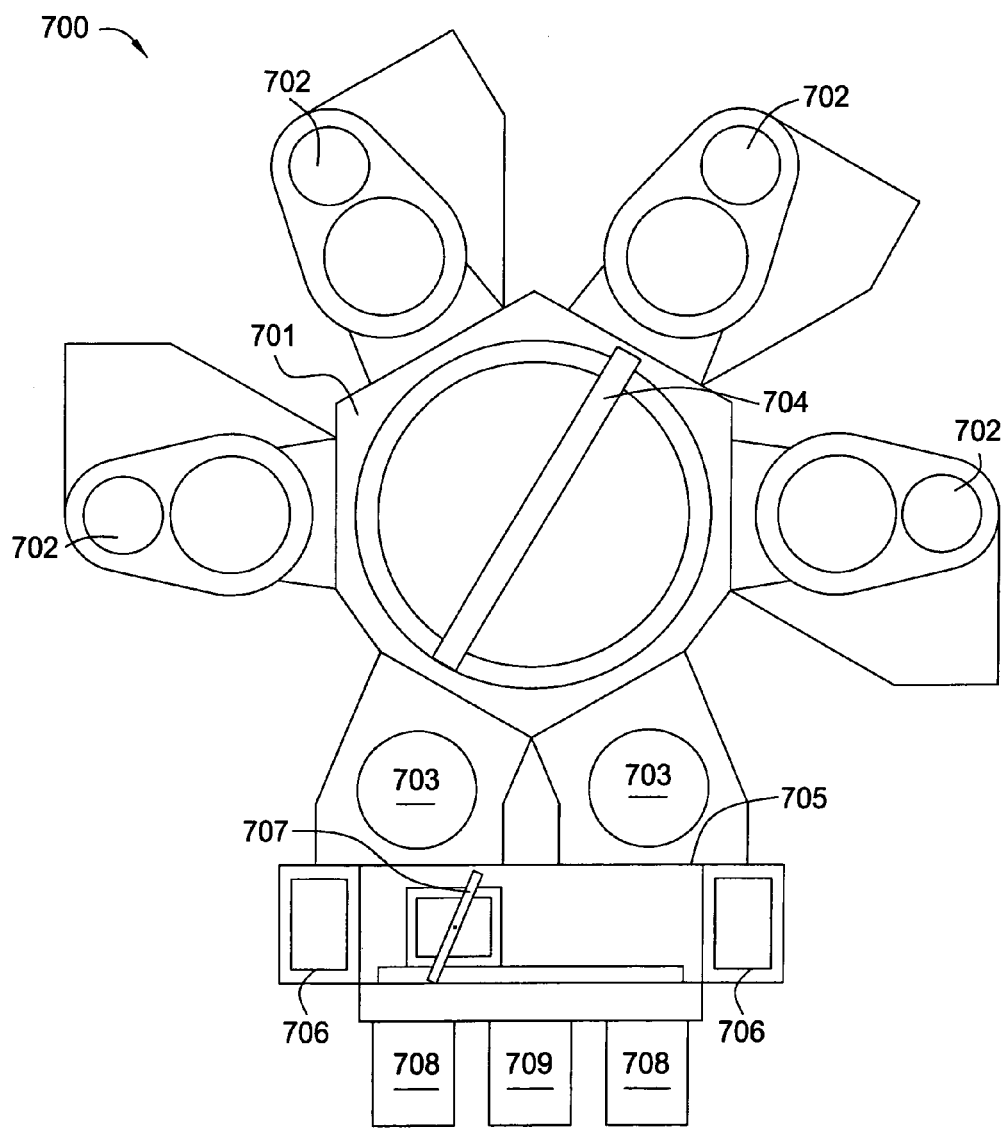
FIG. 7 is a diagram of one embodiment of an integrated etch system.

An example of an etch system that is integrated with an ex-situ metrology tool with the capability of measuring CDs and phase shift angle is shown in FIG. 7. The system, Tetra II™, comprises a chamber or "mainframe" 701, such as the Centura™ processing system available from Applied Materials, Inc. of Santa Clara, Calif., for mounting a plurality of processing chambers, e.g., Tetra II™ photomask reactors (or chambers) 702, and one or more transfer chambers 703, also called "load locks". In one embodiment of the present invention, four etch reactors 702 are mounted to the mainframe 701. In one exemplary embodiment, three etchers 702 are used for etching and one is optionally used for post-etch cleaning (i.e. removing photoresist polymers and other residue from wafers after etching). A robot 704 is provided within the mainframe 701 for transferring wafers between the processing reactors 702 and the transfer chambers 703. The transfer chambers 703 are connected to a factory interface 705, also known as a "mini environment", which maintains a controlled environment. Metrology (or measurement) tools 706, such as CD measuring tool or phase angle measurement tool, are integrated in the load lock area 705 and with high-speed data collection and analysis capabilities. Sampled wafer or every wafer that enters the system 700 is measured for thickness before and after etch processing. The metrology tool 706 could also be placed at different location within the process system 700. Cassette holders 708 are connected to the other end of the factory interface 705. 709 could be configured to be a cassette holder (same as 708) or to place a metrology tool (same as 706). A robot 707 is placed inside 705 to transfer substrate between cassette holders (708 and possibly 709), measuring tools (706 and possibly 709) and "load locks" (703). One or more of the process chambers 702 could also be deposition chambers, since the concept of the invention also applies to deposition process.

While the foregoing is directed to the preferred aspects of the invention, other and further aspects of the invention may be devised without departing from the basic scope thereof, and the scope thereof is determined by the claims that follow.

The invention claimed is:

1. A method of controlling the critical dimensions of a photomask substrate, comprising:
   providing a photomask substrate with a metal layer on top;
   performing a photolithographic process to form a printed pattern on said photomask substrate;
   measuring pre-etch critical dimensions of the printed pattern on said photomask substrate by an integrated measuring tool;
   providing an initial etch recipe for a metal etch process;
   modifying the etch recipe based on the pre-etch critical dimension data of said photomask substrate; performing the etch process on said photomask substrate based on the modified etch recipe to form an etched pattern on said photomask substrate; and
   measuring post-etch critical dimensions of the etched pattern.

2. The method of claim 1 further comprising:
   modifying the initial etch recipe for the next photomask substrate based on the post-etch critical dimensions data.

3. The method of claim 2 further comprising:
   determining if the pre-etch critical dimensions are within specification;
   if the pre-etch critical dimensions are within specification, sending the substrate to the next process step; and
   if the pre-etch critical dimensions are out of specification, performing rework by removing photoresist from the substrate, and re-patterning the substrate with photoresist.

4. The method of claim 2 wherein the photomask is a binary photomask.

5. The method of claim 4 wherein the metal is chromium.

6. The method of claim 2 wherein the photomask is an attenuated photomask.

7. The method of claim 6 wherein the metal is molybdenum silicide.

8. The method of claim 2 wherein the photomask is an alternate photomask.

9. The method of claim 8 wherein the metal is chromium.

10. A method of monitoring the phase shift angle of a phase shift photomask, comprising:
    providing a photomask substrate with an etched metal layer;
    performing a photolithographic process to form a printed pattern on the photomask substrate;
    measuring pre-etch critical dimensions of the printed pattern on the photomask substrate by an integrated measuring tool;
    modifying an etch recipe utilized to etch the photomask substrate based on the measured pre-etch critical dimension data;
    etching the photomask substrate;
    removing the remaining photoresist;
    removing the remaining metal layer; and
    measuring the phase shift angle and its uniformity across the substrate by the integrated measuring tool.

11. The method of claim 10 further comprising:
    determining if the measured data of phase shift angle and its uniformity across the substrate are within specification;
    if the measured data are within specification, the photomask process sequence is complete; and
    if the measured data are out of specification, the photomask is marked out of specification.

12. The method of claim 10 wherein the phase shift mask is an alternate phase shift mask.

13. The method of claim 12 wherein the metal is chromium.

14. The method of claim 12 wherein the photomask substrate is quartz.

15. A method of monitoring the phase shift angle of a phase shift photomask, comprising:
    providing a photomask substrate with a light-shielding metal layer on top of a translucent metal layer, which is deposited on the substrate;
    performing a photolithographic process to form a printed pattern on the photomask substrate;
    measuring pre-etch critical dimensions of the printed pattern on the photomask substrate by an integrated measuring tool;
    modifying an etch recipe utilized to etch the photomask substrate based on the measured pre-etch critical dimension data;
    etching the light-shielding metal layer;
    removing the remaining photoresist;
    etching the translucent metal layer;
    removing the light-shielding metal layer; and
    measuring the phase shift angle and its uniformity across the substrate by the integrated measuring tool.

16. The method of claim 15 further comprising:
    determining if the measured data of phase shift angle and its uniformity across the substrate are within specification;
    if the measured data are within specification, considering the photomask process sequence is complete; and
    if the measured data are out of specification, marking the photomask out of specification.

17. The method of claim 15 wherein the phase shift mask is an attenuated phase shift mask.

18. The method of claim 17 wherein the translucent metal layer is molybdenum silicide.

19. A method of controlling the critical dimension of the features of a photomask substrate, comprising:
    measuring pre-etch critical dimensions of features of a photomask substrate by an integrated measuring tool;
    etching the features according to an etch recipe for specified critical dimensions of the features modified based on the measured pre-etch critical dimensions of the features;
    measuring the features to determine conformity with the specified critical dimensions by the integrated measuring tool;
    determining from the measurement the modifications of the etch recipe required to conform to the specified critical dimensions; and
    etching another photomask substrate according to the modified etch recipe.

* * * * *